(12) United States Patent
Lin et al.

(10) Patent No.: US 12,272,725 B2
(45) Date of Patent: Apr. 8, 2025

(54) LOW WARPAGE HIGH DENSITY TRENCH CAPACITOR

(71) Applicant: Taiwan Semiconductor Manufacturing Co. Ltd., Hsin-Chu (TW)

(72) Inventors: Jyun-Ying Lin, Wujie Township (TW); Hsin-Li Cheng, Hsinchu (TW); Jing-Hwang Yang, Hsinchu County (TW); Felix Ying-Kit Tsui, Cupertino, CA (US); Chien-Li Kuo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/341,498

(22) Filed: Jun. 26, 2023

(65) Prior Publication Data

US 2023/0361166 A1   Nov. 9, 2023

Related U.S. Application Data

(60) Division of application No. 17/104,636, filed on Nov. 25, 2020, now Pat. No. 11,688,762, which is a
(Continued)

(51) Int. Cl.
*H01L 49/02* (2006.01)
*H01L 21/027* (2006.01)
(Continued)

(52) U.S. Cl.
CPC .......... *H01L 28/91* (2013.01); *H01L 21/0274* (2013.01); *H01L 21/30604* (2013.01);
(Continued)

(58) Field of Classification Search
CPC ................. H01L 28/91; H01L 21/0274; H01L 21/30604; H01L 21/31053;
(Continued)

(56) References Cited

U.S. PATENT DOCUMENTS 9,209,190 B2   12/2015   Chen et al.
9,608,130 B2   3/2017    Tran et al.
(Continued)

FOREIGN PATENT DOCUMENTS

CN    106997878 A    8/2017

OTHER PUBLICATIONS

Non-Final Office Action dated Sep. 26, 2018 for U.S. Appl. No. 15/694,218.
(Continued)

*Primary Examiner* — Cuong B Nguyen
(74) *Attorney, Agent, or Firm* — HAYNES AND BOONE, LLP

(57) ABSTRACT

A capacitor structure and method of forming the capacitor structure is provided, including a providing a doped region of a substrate having a two-dimensional trench array with a plurality of segments defined therein. Each of the plurality of segments has an array of a plurality of recesses extending along the substrate, where the plurality of segments are rotationally symmetric about a center of the two-dimensional trench array. A first conducting layer is presented over the surface and a bottom and sidewalls of the recesses and is insulated from the substrate by a first dielectric layer. A second conducting layer is presented over the first conducting layer and is insulated by a second dielectric layer. First and second contacts respectively connect to an exposed top surface of the first conducting layer and second conducting layer. A third contact connects to the substrate within a local region to the capacitor structure.

20 Claims, 11 Drawing Sheets

Related U.S. Application Data continuation of application No. 16/387,844, filed on Apr. 18, 2019, now Pat. No. 10,868,110, which is a division of application No. 15/694,218, filed on Sep. 1, 2017, now Pat. No. 10,276,651.

(51) Int. Cl.

| | | |
|---|---|---|
| *H01L 21/306* | (2006.01) | |
| *H01L 21/3105* | (2006.01) | |
| *H01L 21/311* | (2006.01) | |
| *H01L 21/3205* | (2006.01) | |
| *H01L 21/321* | (2006.01) | |
| *H01L 21/3213* | (2006.01) | |
| *H01L 21/764* | (2006.01) | |
| *H01L 23/00* | (2006.01) | |
| *H01L 27/01* | (2006.01) | |
| *H01L 29/66* | (2006.01) | |
| *H01L 29/94* | (2006.01) | |
| *H10B 12/00* | (2023.01) | |
| *H01L 27/08* | (2006.01) | |

(52) U.S. Cl.
CPC .. *H01L 21/31053* (2013.01); *H01L 21/31111* (2013.01); *H01L 21/32055* (2013.01); *H01L 21/3212* (2013.01); *H01L 21/32133* (2013.01); *H01L 21/764* (2013.01); *H01L 23/562* (2013.01); *H01L 27/016* (2013.01); *H01L 28/87* (2013.01); *H01L 28/92* (2013.01); *H01L 29/66181* (2013.01); *H01L 29/945* (2013.01); *H10B 12/0387* (2023.02); *H10B 12/37* (2023.02); H01L 27/0805 (2013.01); H01L 2224/13101 (2013.01); H01L 2224/2919 (2013.01); H01L 2224/32145 (2013.01); H01L 2224/32225 (2013.01); H01L 2224/48091 (2013.01); H01L 2224/48227 (2013.01); H01L 2224/73204 (2013.01); H01L 2224/73265 (2013.01); H01L 2924/00014 (2013.01); H01L 2924/1304 (2013.01); H01L 2924/1305 (2013.01); H01L 2924/13091 (2013.01); H01L 2924/14 (2013.01); H01L 2924/15311 (2013.01); H01L 2924/181 (2013.01); H01L 2924/19011 (2013.01); H01L 2924/19103 (2013.01); H01L 2924/19105 (2013.01); H01L 2924/3511 (2013.01)

(58) Field of Classification Search
CPC ......... H01L 21/31111; H01L 21/32055; H01L 21/3212; H01L 21/32133; H01L 21/764; H01L 23/562; H01L 27/016; H01L 27/10829; H01L 27/1087; H01L 28/87; H01L 28/92; H01L 29/66181; H01L 29/945; H01L 27/0805; H01L 2224/13101; H01L 2224/2919; H01L 2224/32145; H01L 2224/32225; H01L 2224/48091; H01L 2224/48227; H01L 2224/73204; H01L 2224/73265; H01L 2924/00014; H01L 2924/1304; H01L 2924/1305; H01L 2924/13091; H01L 2924/14; H01L 2924/15311; H01L 2924/181; H01L 2924/19011; H01L 2924/19103; H01L 2924/19105; H01L 2924/3511; H01L 24/13; H01L 24/16; H01L 24/29; H01L 24/32; H01L 24/48; H01L 24/73; H01L 2224/131; H01L 2224/451; H01L 2924/1434; H01L 25/04; H01L 28/40

See application file for complete search history.

(56) References Cited

U.S. PATENT DOCUMENTS

| | | |
|---|---|---|
| 10,276,651 B2 | 4/2019 | Lin et al. |
| 2009/0244808 A1 | 10/2009 | Ohtsuka et al. |
| 2013/0161792 A1 | 6/2013 | Tran et al. |
| 2013/0279102 A1 | 10/2013 | Brian |
| 2014/0374880 A1* | 12/2014 | Chen ...................... H01L 28/40 257/532 |
| 2015/0076657 A1 | 3/2015 | Chou et al. |
| 2015/0145103 A1 | 5/2015 | Chou et al. |
| 2016/0020267 A1 | 1/2016 | Lin |

OTHER PUBLICATIONS

Notice of Allowance dated Jan. 24, 2019 for U.S. Appl. No. 15/694,218.

Non-Final Office Action dated May 14, 2020 for U.S. Appl. No. 16/387,844.

Notice of Allowance dated Aug. 26, 2020 for U.S. Appl. No. 16/387,844.

* cited by examiner

700 ⇘

```
                    ┌─────────┐
                    │  START  │
                    └─────────┘
                         │
                         ▼
```

┌──────────────────────────────────────────────────────────────────┐ ╭─ 702
│ Deposit a plurality of first POLY layers of uniform thickness over a │
│ bottom region and sidewalls of a recess formed within a substrate in │
│ a rotationally symmetric pattern and over a surface of the substrate, │
│ wherein the plurality of first POLY layers are separated from one │
│ another and the substrate by a plurality of first ONO layers │
└──────────────────────────────────────────────────────────────────┘

┌──────────────────────────────────────────────────────────────────┐ ╭─ 704
│ Deposit a second POLY layer over the plurality of first POLY layers, │
│ wherein the second POLY layer fills a remainder of the recess not │
│ filled by the plurality of first POLY layers while leaving an air gap, and │
│ wherein the second POLY layer is separated from the first POLY │
│ layer by a second oxide/ONO layer │
└──────────────────────────────────────────────────────────────────┘

┌──────────────────────────────────────────────────────────────────┐ ╭─ 706
│ Remove portions of the second POLY layer and the second ONO │
│ layer not within the recess │
└──────────────────────────────────────────────────────────────────┘

┌──────────────────────────────────────────────────────────────────┐ ╭─ 708
│ Remove a portion of each of the plurality of first POLY layers and the │
│ first ONO layers on the surface which are not within a doped region │
│ in a vicinity of the recess with a first pattern and etch process such │
│ that a top surface of each of the plurality of first POLY layers is │
│ exposed within the doped region │
└──────────────────────────────────────────────────────────────────┘

```
                    ┌─────────┐
                    │   END   │
                    └─────────┘
```

Fig. 8

LOW WARPAGE HIGH DENSITY TRENCH CAPACITOR

REFERENCE TO RELATED APPLICATIONS

This application is a Divisional of U.S. application Ser. No. 17/104,636, filed on Nov. 25, 2020, which is a Continuation of U.S. application Ser. No. 16/387,844, filed on Apr. 18, 2019 (now U.S. Pat. No. 10,868,110, issued on Dec. 15, 2020), which is a Divisional of U.S. application Ser. No. 15/694,218, filed on Sep. 1, 2017 (now U.S. Pat. No. 10,276,651, issued on Apr. 30, 2019). The contents of the above-referenced Patent Applications are hereby incorporated by referenced in their entirety.

BACKGROUND

A trench capacitor exhibits high power density relative to some other capacitor types within a semiconductor integrated circuit (IC). As such, trench capacitors are utilized in applications such as dynamic random-access memory (DRAM) storage cells, among other applications. Some examples of trench capacitors include high density multiple-polysilicon (multi-POLY) deep trench capacitors (DTCs) which are utilized in advanced technology node processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a flow chart of some other embodiments of a method for forming a capacitor structure.

DETAILED DESCRIPTION

Figure 1A:
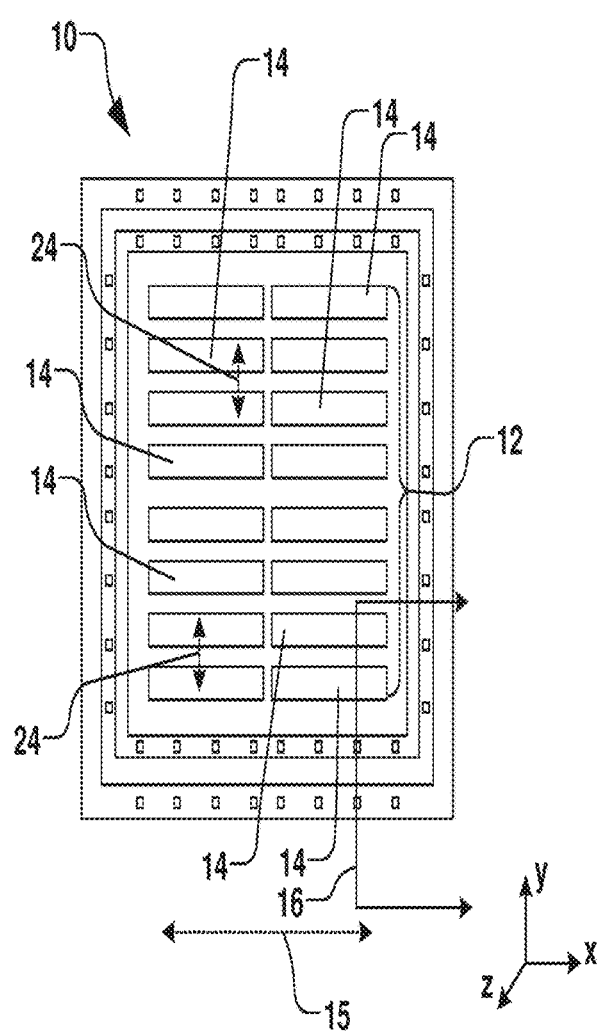
FIG. 1A illustrates a plan view of some embodiments of an integrated circuit (IC) die comprising a trench capacitor.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of trench capacitor structures, which may be included in an integrated circuit (IC) such as a microprocessor, memory device, and/or some other IC. The IC may also include various passive and active microelectronic devices, such as resistors, other capacitor types (e.g., a metal-insulator-metal capacitor (MIMCAP)), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize other embodiments of semiconductor devices that may benefit from aspects of the present disclosure.

Some methods of forming a trench capacitor comprise forming a two-dimensional array of trenches in a substrate (e.g., a wafer). A stack of conductive layers is formed covering the substrate and completely fill the array of trenches. Further, the conductive layers are vertically stacked and each conductive layer lines the trenches. The conductive layers are individually patterned sequentially from a top of the conductive-layer stack to a bottom of the conductive-layer stack. The sequential patterning of the conductive layers forms a stack of electrodes respectively from the conductive layers, where the electrodes are vertically stacked and each electrode lines the trenches. An inter-layer dielectric (ILD) layer is formed covering the substrate and the electrode stack, and a chemical-mechanical polish (CMP) is performed into a top of the ILD layer. Contact vias are formed extending through the ILD layer to the electrodes.

A challenge with the trench capacitor is that the two-dimensional trench array has mirror symmetry in each of the two dimensions. The mirror symmetry leads to un-balanced stress on the substrate, which may lead to warping, breaking, or cracking of the substrate. As trench densities increase (e.g., due to smaller process nodes), the foregoing issues are expect become more prominent.

As illustrated in FIG. 1A, a plan view of some embodiments of an IC die 10 is illustrated. The IC die 10 comprises a two-dimensional array 12 of capacitor structures 14 that are generally uniformly aligned lengthwise in a predetermined direction 15 (e.g., lengthwise in the x-direction). For ease of illustration, only some of the capacitor structures 14 are labeled 14. As used herein, each capacitor structure 14 may comprise, for example, a trench and a plurality of layers lining the trench. In some embodiments, each capacitor structure 14 comprises a trench, a dielectric layer lining the trench, and a conductive layer lining the trench over the dielectric layer.

Figure 1B:
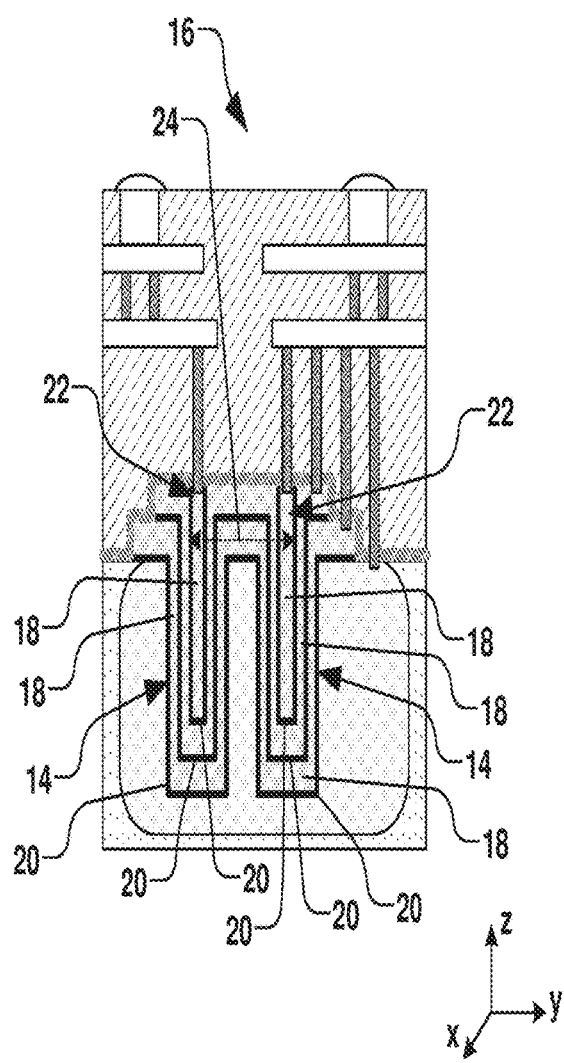
FIG. 1B illustrates a partial cross-sectional view of some embodiments the IC die of FIG. 1A

FIG. 1B illustrates a cross-section of a portion 16 of the IC die 10 of FIG. 1A, whereby an architecture of the capacitor structures 14 may be appreciated. As illustrated in FIG. 1B, the capacitor structures 14 are fully filled with conductive layers 18 (e.g., doped polysilicon) and dielectric layers 20, whereby the trench and surrounding areas form a void-free structure 22.

Figure 1C:
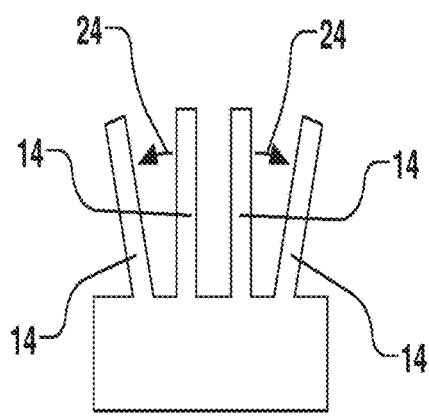
FIG. 1C is a schematic representation of some embodiments of a trench capacitor under stress.

It is presently appreciated that the substantially uniform alignment of the array 12 of capacitor structures 14 in the predetermined direction 15 of FIG. 1A, for example, increases a stress 24 (illustrated as arrows in FIGS. 1A and 1C) between the individual capacitor structures, whereby the stresses increase a likelihood of warpage and/or fracturing of the IC die 10 as well as the wafer (not shown) on which a plurality of IC dies 10 are formed. Furthermore, as the capacitor structures 14 are fully-filled with the conductive layers 18 and dielectric layers 20 of FIG. 1B, such filling in believed to exacerbate the lines of stress 24, as illustrated schematically in FIG. 1C.

The present disclosure thus provides various novel trench designs and layouts for high density trench capacitors that yield less warpage associated with the die and wafer. Accordingly, some embodiments of the present disclosure will be disclosed infra, wherein a novel capacitor structure and method of forming a capacitor structure are provided.

Figure 2A:
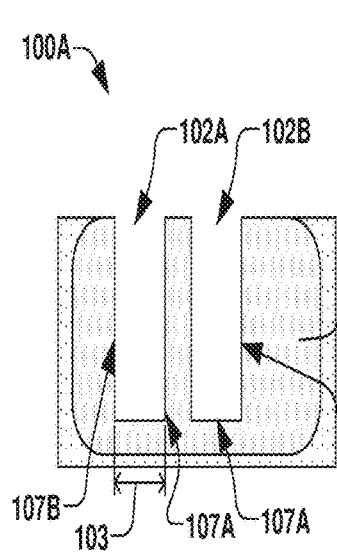
FIGS. 2A-2F illustrate a series of cross-sectional views of some embodiments of a method for forming a capacitor structure.

FIGS. 2A-2F illustrate some embodiments of a capacitor structure formation, such as a double polysilicon deep trench capacitor (double-POLY DTC) formation. It is noted that while double-POLY DTC or multi-POLY DTC formations are described herein, the present disclosure similarly applies to various other capacitor structures including any number of POLY layers. FIG. 2A, for example, illustrates a substrate 100A, wherein first and second recesses 102A, 102B are formed within a doped region 104 of the substrate 100A. For DTC applications such as volatile DRAM, a plurality of recesses are patterned in an array, where each recess contains an identical structure after DTC formation.

For the embodiments of FIGS. 2A-2F, the substrate 100A is a p-type silicon substrate. Other substrate types may comprise an n-type silicon substrate, or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 100A is a semiconductor on insulator (SOI).

For the embodiments of FIGS. 2A-2F, the doped region 104 of the substrate 100A is formed through an ion implantation technique of an n-type dopant, in which ionized phosphors, arsenic, antimony, or some other dopant are accelerated in an electrical field and impacted on the surface of the substrate 100A. After the dopant ions are implanted, a first thermal anneal is performed to drive-in and to activate the dopants, in accordance with some embodiments. The first thermal anneal may, for example, utilize rapid thermal processing (RTP) anneal, spike anneal, millisecond anneal, laser anneal, or some other annealing process. Spike anneals, for example, operate at peak anneal temperatures in the order of seconds. Millisecond anneals, for example, operate at peak anneal temperatures in the order of milliseconds. Laser anneals, for example, operate at peak anneal temperatures in the order of micro seconds.

One or more etching processes, for example, may be used to form the first and second recesses 102A, 102B, including dry etching process(es) such as a plasma etching, wet etching process(es), or a combination thereof. In some embodiments, the dry plasma etch comprises a bombarding the substrate with ions (e.g., fluorocarbons, oxygen, chlorine, nitrogen, argon, helium, etc.) that dislodge portions of the material from the substrate 100A. Wet etching may also be utilized to achieve an isotropic etch profile in some embodiments. For example, an etchant such as carbon tetrafluoride ($CF_4$). HF, tetramethylammonium hydroxide (TMAH), combinations thereof, or the like may be used to perform the wet etch and form the first and second recesses 102A, 102B in some embodiments. A width 103 (e.g., in the y-direction) of the first and second recesses 102A. 102B, for example, may be on the order of one micron, while a length (e.g., in the x-direction) may be approximately 5-20 times the width.

Figure 2B:
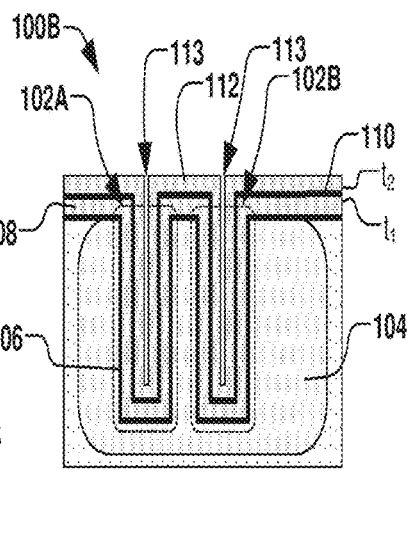

FIG. 2B illustrates a substrate 100B comprising the substrate 100A, wherein a first dielectric layer 106 is deposited over a bottom region 107A and sidewall region 107B of the first and second recesses 102A. 102B of FIG. 2A. In some embodiments, the first dielectric layer 106 of FIG. 2B comprises oxide/nitride/oxide (ONO) composite layer. The deposition of the first dielectric layer may, for example, be achieved through chemical vapor deposition (CVD), some derivative CVD processes, or some other deposition process. Derivative CVD processes comprise low pressure CVD (LPCVD), atomic layer CVD (ALCVD), ultrahigh vacuum CVD (UHVCVD), reduced pressure CVD (RPCVD), or any combinations thereof.

A first conducting layer 108, for example, is further deposited over the first dielectric layer 106, and has a substantially uniform first thickness $t_1$. In some embodiments, the first conducting layer 108 comprises a deposition of polysilicon (POLY). The deposition of polysilicon, for example, may be achieved by pyrolyzing silane ($SiH_4$) inside a low-pressure reactor at a temperature in a range of approximately 500 degrees Celsius to approximately 700 degrees Celsius to release silicon which accumulates on the surface of the substrate 100A and along the bottom and sidewall regions 107A, 107B of the first and second recesses 102A, 102B shown in FIG. 2A.

A second dielectric layer 110 shown in FIG. 2B, for example, is deposited over the first conducting layer 108, and a second conducting layer 112 is deposited over the second dielectric layer 110. In some embodiments, the second dielectric layer 110 comprises an ONO composite layer, and deposition of the second dielectric layer 110 is achieved through chemical vapor deposition (CVD) or some other deposition process.

In accordance with the present disclosure, the second conducting layer 112 fills the first and second recesses 102A, 102B not filled by the first conducting layer 108, while advantageously maintaining an air gap 113 within the first and second recesses 102A. 102B. The present disclosure contemplates that the air gap 113 advantageously reduces the stresses discussed above. The second conducting layer 112, for example, has a second thickness $t_2$ that is substantially uniform across the surface of the substrate 100B. The width 103 of the first and second recesses 102A. 102B of FIG. 2A, for example, may be increased (e.g., by approximately 0.05 microns) to accommodate the air gap 113 of FIG. 2B, in order to maintain the desired first and second thicknesses $t_1$, $t_2$ of the respective first and second conducting layer 108, 112. The air gap 113, for example, may have a width of approximately 0.05 microns. In some embodiments, the second conducting layer 112 may comprise polysilicon layer (POLY). In some embodiments, the second thickness is approximately equal to the first thickness $t_1$. In other embodiments, the second thickness $t_2$ is substantially greater than the first thickness $t_1$.

Figure 2C:
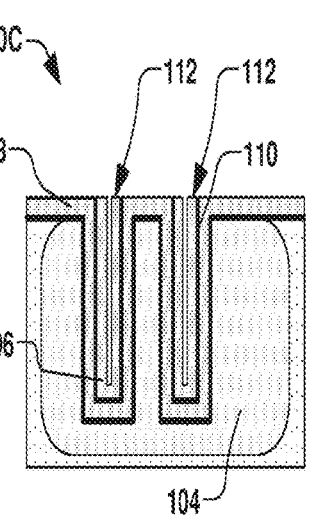

FIG. 2C illustrates an example where a substrate 100C comprises the substrate 100B, and where portions of the second conducting layer 112 and the second dielectric layer 110 not within the first and/or second recess 102A. 102B have been removed through a first planarization process, such as a first CMP process. For example, the planarized first conducting layer 108 and the planarized second conducting layer 112 have a substantially planar surface after the first CMP process is performed. In the first CMP process, for example, chemical and mechanical forces are exerted on the substrate 100C by a rotating platen covered by a polishing pad, which in conjunction with a slurry, polishes and globally planarizes the substrate 100C. The slurry, for example, may include hydrogen peroxide or other suitable material.

Figure 2D:
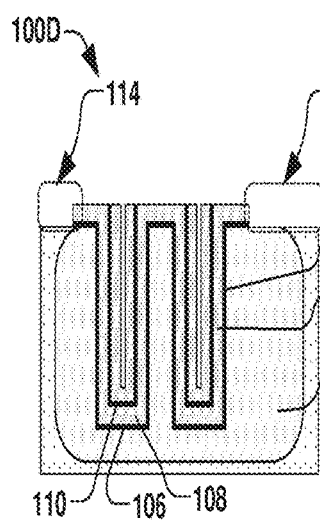

FIG. 2D illustrates a substrate 100D comprising the substrate 100C, wherein portions of the first conducting layer 108 and the first dielectric layer 106 have been removed by a pattern and etch process on the surface. For example, the substrate 100D is coated with a layer of photoresist in a spin-on tool, aligned with a mask containing a pattern, and exposed to light which transfers the pattern into the photoresist. In some embodiments, the pattern and etch process uses a positive tone photoresist such that exposed areas of the photoresist layer become soluble upon being exposed, and are subsequently removed. In some embodiments, the pattern and etch process uses a negative tone photoresist such that exposed areas of the photoresist layer become insoluble to a photoresist developer upon being exposed. The photoresist developer is used to dissolve the soluble portion of the photoresist, and the exposed or unexposed features on the semiconductor substrate may then be removed, depending upon the tone of the photoresist.

Figure 2E:
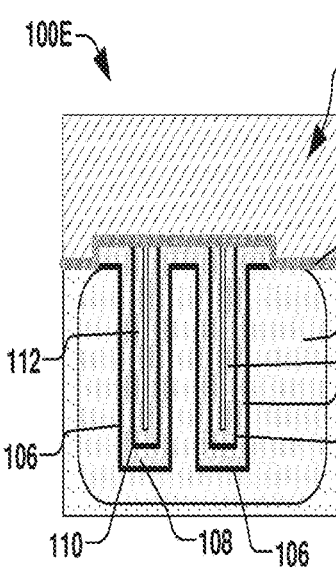

FIG. 2E illustrates a substrate 100E comprising the substrate 100D, an oxide layer 116 is disposed on a surface of the substrate 100E through an oxidation step. An Inter-layer Dielectric (ILD) layer 118, such as tetraethylorthosilicate (TEOS) or flourine or carbon-doped $SiO_2$, is disposed over the oxide layer 116 by a derivative CVD processes or other appropriate method. The ILD layer 118, for example, is configured to electrically separate contacts formed in a subsequent patterning step, and has a dielectric constant lower than an approximate k=3.9 value of undoped $SiO_2$, and as close to 1 as possible to minimize capacitive coupling between adjacent metal and contacts.

Figure 2F:
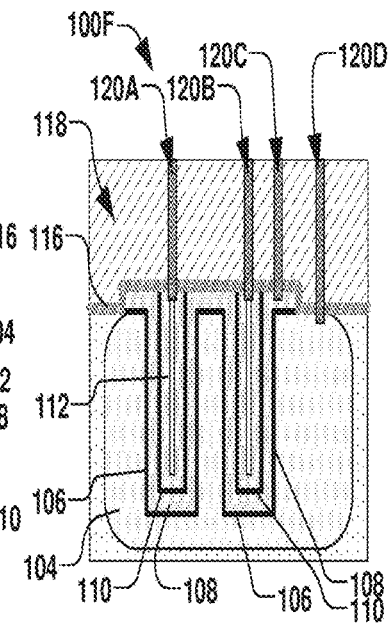

After a planarization of the ILD layer 118 through a second CMP process, trenches are etched and filled with a conductive material (e.g., copper, tungsten, etc.) to form first second contacts 120A, 120B to the second conducting layer 112, a third contact 120C to the first conducting layer 108, and a fourth contact 120D to the doped region 104 to complete the double-POLY DTC structure 100F of FIG. 2F.

FIGS. 3A-3F illustrate other embodiments of a formation of a capacitor structure. In general, while the multi-POLY DTC formation examples illustrated and described herein comprise a specific number (e.g., two, three, etc.) of conducting and dielectric layers, any number of conducting and dielectric layers may be used and are contemplated as falling within the scope of the present disclosure.

Figure 3A:
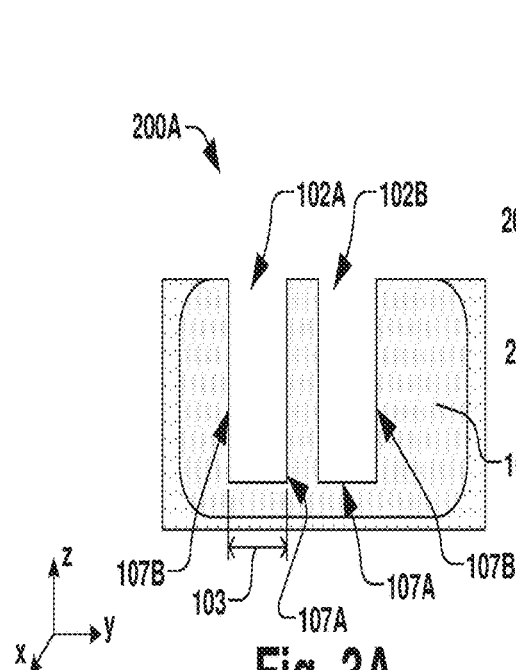
FIGS. 3A-3E illustrate a series of cross-sectional views of some other embodiments of a method for forming a capacitor structure.
Figure 3B:
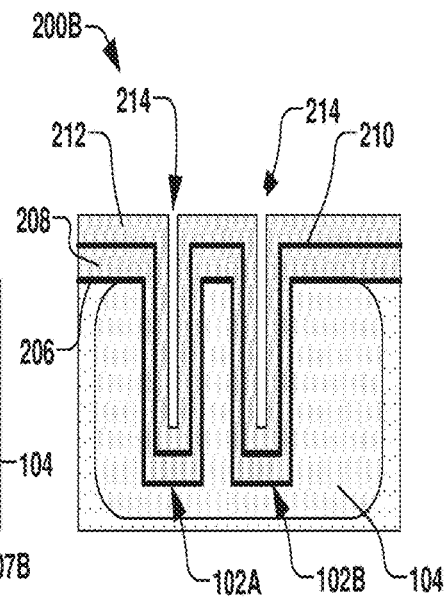

The embodiments of FIG. 3A, for example, may be identical to those of FIG. 2A, and will not be described in additional detail. FIG. 3B illustrates a substrate 200B comprising the substrate 200A, wherein a first ONO layer 206 (e.g., a dielectric layer) is formed over the bottom region 107A and sidewall regions 107B of the first and second recesses 102A, 102B of FIG. 3A. A first POLY layer 208 (e.g., a conductive layer) of FIG. 3B having a substantially uniform thickness is further deposited over the first ONO layer 206. A second ONO layer 210 is deposited over the first POLY layer 208, and a second POLY layer 212 of substantially uniform thickness is deposited over the first POLY layer. In accordance with the present disclosure, the second POLY layer 212 further provides an air gap 214 within the first and second recesses.

Figure 3C:
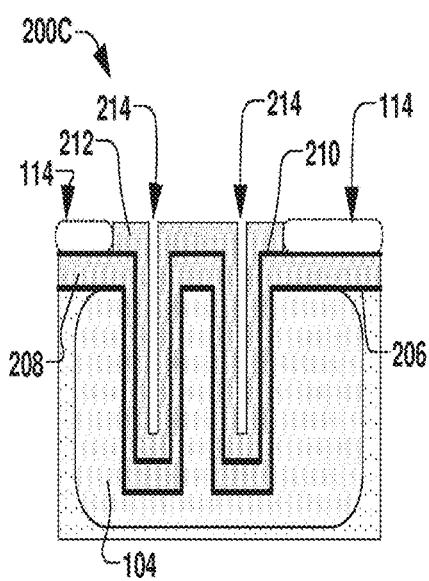

FIG. 3C illustrates a substrate 200C comprising the substrate 200B, wherein portions 114 of the second POLY layer 212 and second ONO layer 210 have been removed by a first pattern and etch process on the surface, exposing a top surface of the second POLY layer 212 for contact formation.

Figure 3D:
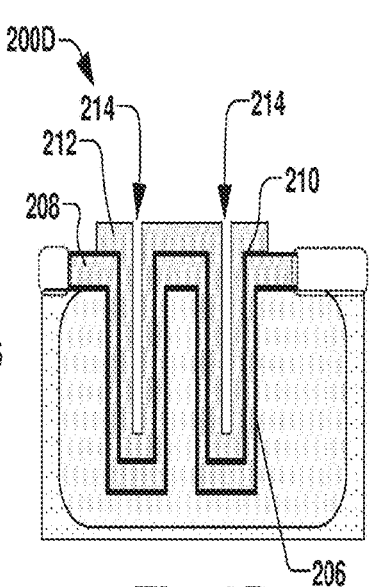

FIG. 3D illustrates a substrate 200D comprising the substrate 200D, wherein portions of the first POLY layer 208 and first ONO layer 206 have been removed by a second pattern and etch process on the surface, exposing a top surface of the doped region 104 for contact formation.

Figure 3E:
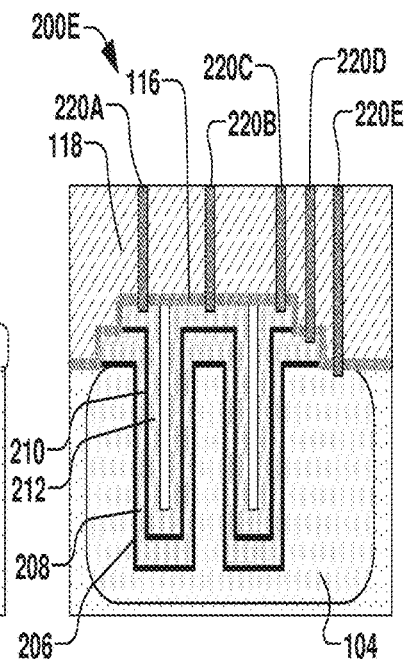

FIG. 3E illustrates a capacitor structure 200E comprising the substrate 200D, wherein a poly oxide layer 116 is disposed on a surface of the substrate 200D, and an ILD layer 118 is disposed above the poly oxide layer 116. After planarization of the ILD layer 118 through a CMP process, trenches are etched and filled with a conductive material to form first through fifth contacts 220A-220E.

Figure 4:
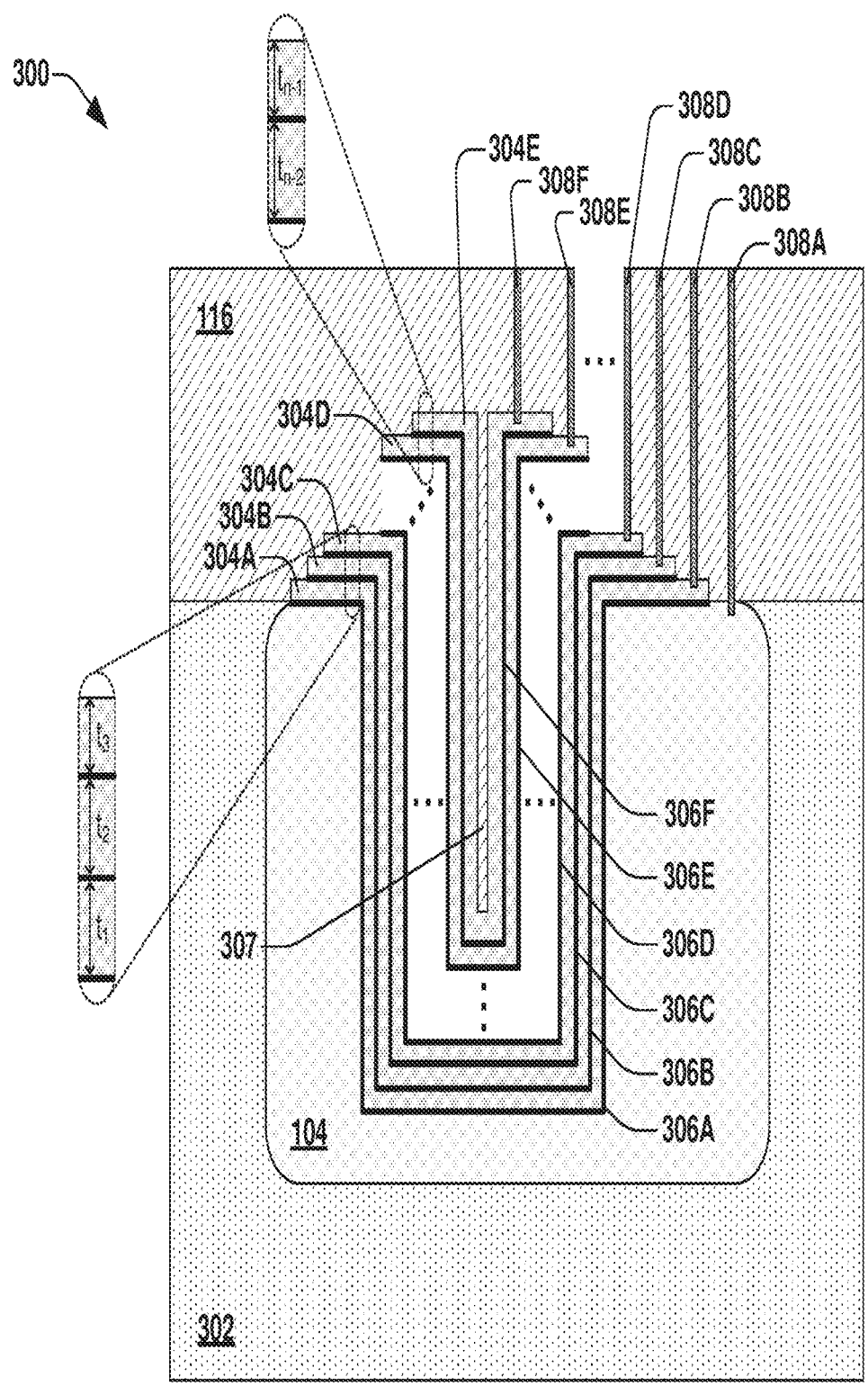
FIG. 4 illustrates a cross-sectional view of some embodiments of a capacitor structure.

In general, the present disclosure appreciates that a capacitor structure consisting of n poly layers (or more generally, n conductive layers) may be assembled in a similar manner as discussed above. FIG. 4, for example, illustrates some embodiments of a capacitor structure 300 (e.g., a multi-POLY DTC) disposed within a doped region 104 (e.g., doped with phosphors, arsenic, or antimony) of a substrate 302. The capacitor structure 300 comprises a first conducting layer 304A (e.g., polysilicon) of a first substantially uniform thickness ($t_1$) disposed over a bottom region and sidewalls of a recess formed within the doped region 104 of the substrate 302 and over a surface of the substrate 302. The first conducting layer 304A is insulated from the substrate 302 by a first dielectric layer 306A (e.g., oxide/nitride/oxide). A second conducting layer 304B of a second substantially uniform thickness ($t_2$) is disposed over the first conducting layer 304A, and separated from the first conducting layer 304A by a second dielectric layer 306B. A third conducting layer 304C of a third substantially uniform thickness ($t_3$) is disposed over the second conducting layer 304B, and separated from the second conducting layer 304B by a third dielectric layer 306C. This type of structure may be repeated until an $(n-1)^{th}$ conducting layer 304E of an $(n-1)^{th}$ substantially uniform thickness ($t_{n-1}$) is disposed over a $(n-2)^{th}$ conducting layer 304E of an $(n-2)^{th}$ substantially uniform thickness ($t_{n-2}$), and separated from the $(n-2)^{th}$ conducting layer 304D by an $(n-2)^{th}$ dielectric layer 306F.

An $n^{th}$ conducting layer 304E is disposed over the $(n-1)^{th}$ conducting layer 304D and insulated from the $(n-1)^{th}$ conducting layer 304D by an $n^{th}$ dielectric layer 306F. The $n^{th}$ conducting layer 304E substantially fills a remainder of the recess not filled by the first through $(n-1)^{th}$ conducting layers 304A-304D, while still maintaining an air gap 307, whereby the $n^{th}$ conducting layer extends above the substrate 302 by an amount greater than an approximate sum of the first through $n^{th}$ thicknesses.

A top surface of each of the first through $n^{th}$ conducting layers 304A-304E are exposed by multiple pattern and etch processes (i.e., n-1 pattern and etch processes) over the doped region 104, such that contacts may be formed to the doped region 104 and the first through $n^{th}$ conducting layers 304A-304E. A first contact 308A (e.g., copper, tungsten, etc.) connects to the doped region 104. A second contact 308B connects to the exposed top surface of the first conducting layer 304A, a third contact 308C connects to the exposed top surface of the second conducting layer 304B, a fourth contact 308D connects to the exposed top surface of the third conducting layer 304C, an $(n-1)^{th}$ contact 308E connects to the exposed top surface of the $(n-1)^{th}$ conducting layer 304D, and an $n^{th}$ contact 308E connects to the exposed top surface of the $(n-1)^{th}$ conducting layer 304D.

Figure 5A:
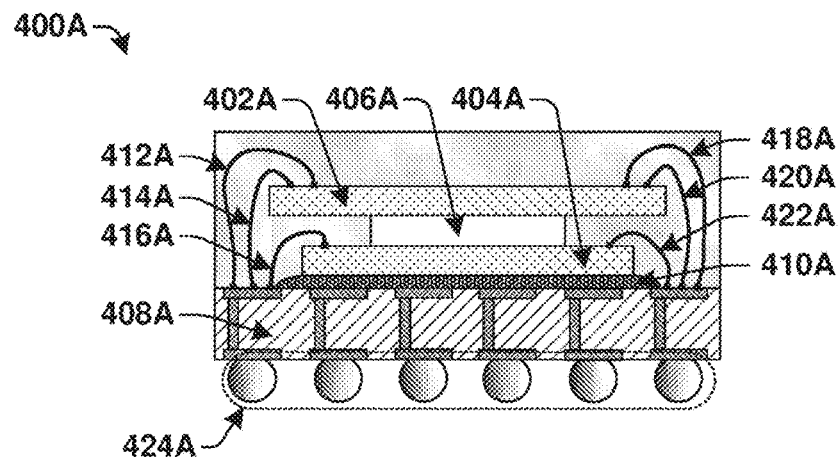
FIGS. 5A-5C illustrate cross-sectional views of various embodiments of electronically coupling an IC die containing a capacitor structure to another IC die by a wire bond, a through silicon via, or a bond pad.

The capacitor structures 100F, 200E, and 300 of FIGS. 2F, 3E, and 4, respectively, in general may be utilized in many IC applications. FIG. 5A illustrates a first three-dimensional (3D) IC structure 400A comprising a high-voltage (HV) or power IC 402A bonded to a capacitor IC 404A comprising one of more DTC structures by an epoxy 406A, wherein the HV or power IC 402A and the capacitor IC 404A are stacked vertically above a substrate 408A and separated from the substrate 408A by an underfill layer 410A. In some embodiments, the underfill layer 410A may comprise one or more of polyimide, polyetherimide, benzocyclobutene (BCB), bismaleimide-triazine (BT), epoxy, or silicone. A plurality of wirebond (WB) structures 412A-422A electrically couple the HV or power IC 402A bonded to the capacitor IC 404A as well as to the substrate 408A which is coupled to a plurality of solder balls 424A to form the 3D IC structure 400A.

Figure 5B:
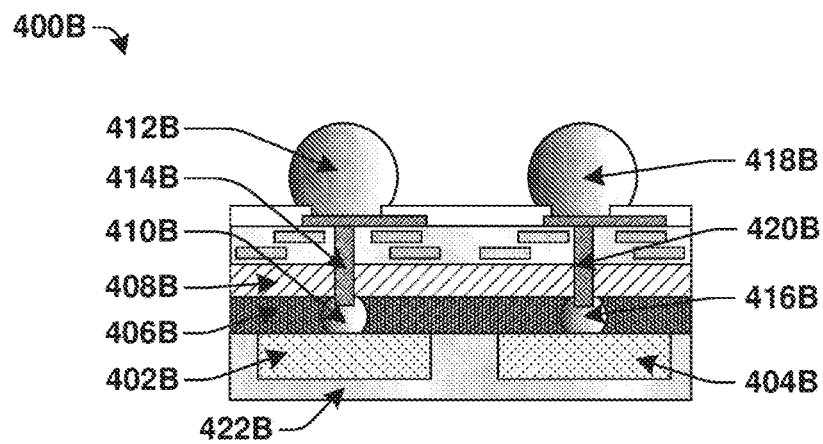

FIG. 5B illustrates a second 3D IC structure 400B, wherein an HV or power IC 402B and a capacitor IC 404A comprising one of more DTC structures reside within a same package 422B, which is bonded to a substrate 408B by an epoxy 406B. A first mini solder ball 410B couples the HV or power IC 402B to a first large solder ball 412B through a first through-silicon via (TSV) 414B. Likewise, a second mini solder ball 416B couples the capacitor IC 404A to a second large solder ball 418B through a second TSV 420B. In some embodiments, the first large solder ball 412B and the second large solder ball 418B, for example, comprise a flip-chip ball grid arrays (FCBGAs) for 2.5D and 3D applications.

Figure 5C:
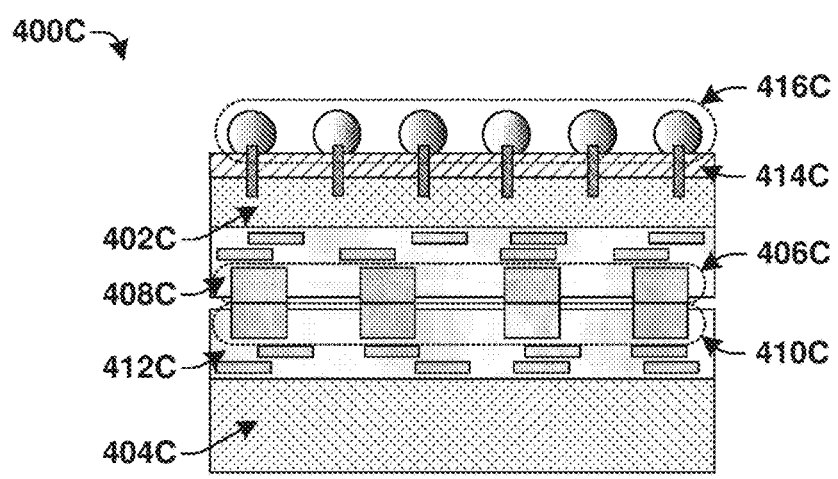

FIG. 5C illustrates a third 3D IC structure 400C, wherein an HV or power IC 402C is coupled to a capacitor IC 404C comprising one of more DTC structures by a plurality of first and second bond pads, 406C and 410C respectively, which reside within first and second packages, 408C and 412C respectively. The HV or power IC 402C is electrically coupled to a plurality of solder balls 416C comprising a FCBGA for 2.5D and 3D applications through a substrate 414C.

Figure 6:
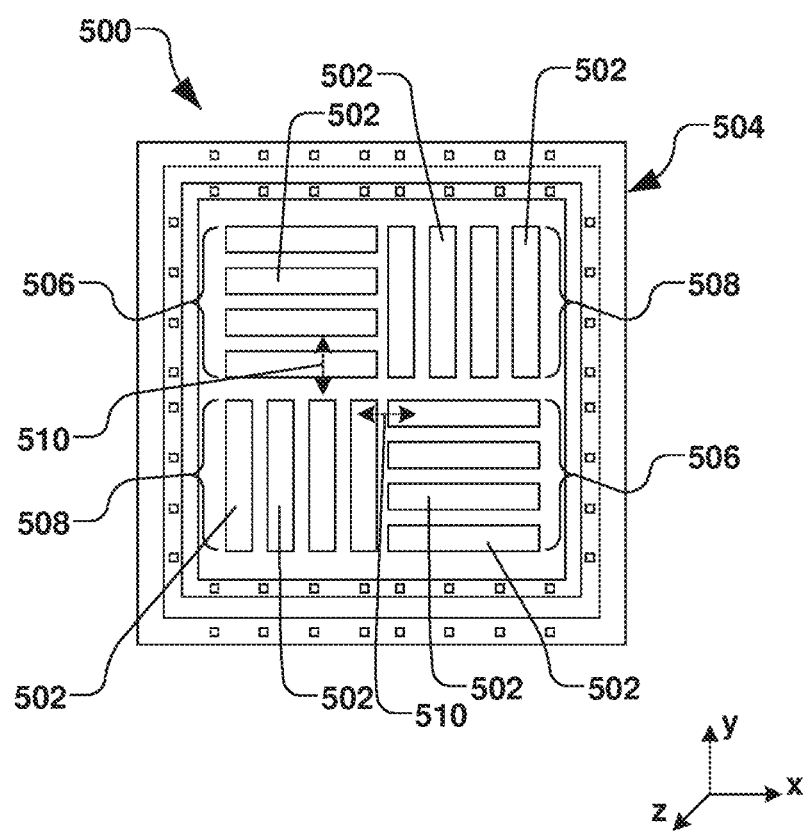
FIG. 6 illustrates a plan view of some other embodiments of an IC die having rotationally symmetric capacitor structures.

FIG. 6 illustrates some embodiments of the present disclosure, whereby the above-described stresses between capacitor structures may be further ameliorated. As densities of capacitors and/or DTCs increase, manufacturing issues such as die and wafer cracking may be advantageously reduced by providing a rotationally symmetric layout 500 of a plurality of capacitors 502 on an IC die 504, as illustrated in FIG. 6. The present disclosure presently appreciates that the rotationally symmetric layout 500 of the plurality of capacitors, for example, reduces lines of stress induced by the uniform layout of the trench capacitors described above in reference to FIG. 1A.

As illustrated in FIG. 6, the IC die 504 is illustrated in plan view, whereby a first array 506 of the capacitors 502 are generally arranged and aligned along a first direction (e.g., along the x-direction), and a second array 508 of the DTCs are generally arranged and aligned along a second direction (e.g., along the y-direction). For example, the first array 506 and second array 508 are rotated approximately 90 degrees with respect to one another. Accordingly, lines of stress 510 are broken between the first and second arrays 506, 508, thus advantageously decreasing a likelihood of cracking and/or warping of the IC die 504 and/or wafer (not shown) on which a plurality of dies are formed.

Numerous other layouts are also contemplated, whereby the lines of stress 510 are broken between the first and second arrays 506, 508, whereby any number of capacitors 502 and arrays 506, 508 may be incorporated, such that the lines of stress 510 are broken between the arrays 506, 508, thus yielding less warpage and cracking of the IC die 504. As such, while the rotationally symmetric layout 500 of the plurality of capacitors 502 is provided as an example, various other layouts, such as asymmetric layouts (not shown) are also contemplated.

Furthermore, in some embodiments, a combination of the rotationally symmetric layout 500 of the plurality of capacitors 502 and the air gap 113, 214 of FIGS. 2B and 3B is contemplated as further decreasing warpage and cracking of the IC die 504. Accordingly, any combination of the air gap 113, 214 of FIGS. 2B and 3B and a layout of the plurality of capacitors 502 such that lines of stress 510 are broken between arrays 506, 508 is contemplated as falling within the scope of the present disclosure.

Figure 7:
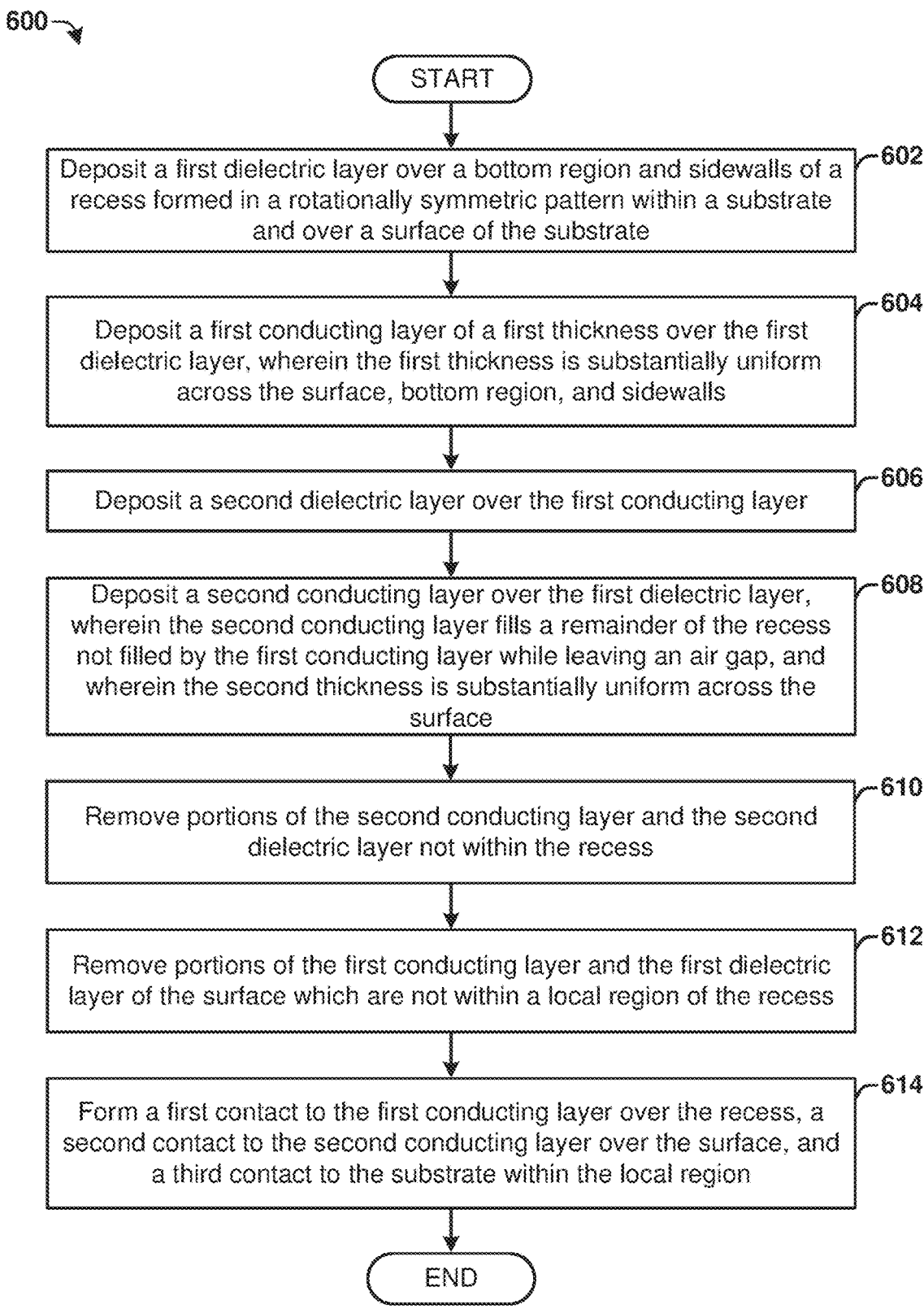
FIG. 7 illustrates a flow chart of some embodiments of a method for forming a capacitor structure.

FIG. 7 illustrates some embodiments of a method 600 of forming a capacitor structure (e.g., a double-POLY capacitor structure). While the method 600 and subsequently method 700 of FIG. 8 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 602 a first dielectric layer is deposited over a bottom region and sidewalls of a plurality of recesses formed within a local region of a substrate and over a surface of the substrate. In some embodiments, the plurality of recesses define first and second arrays, wherein the first and second arrays are rotationally symmetric with one another (e.g., rotated 90 degrees with respect to one another). In some embodiments, the first dielectric layer comprises nitride configured to act as an insulator.

At act 604 a first conducting layer of a first thickness is deposited over the first dielectric layer. The first thickness, for example, is substantially uniform across the surface, bottom region, and sidewalls of the substrate. In some embodiments, the first conducting layer comprises polysilicon.

At act 606 a second dielectric layer is deposited over the first conducting layer. In some embodiments, the second dielectric layer comprises nitride configured to act as an insulator.

At act 608 a second conducting layer is deposited over the first dielectric layer, where the second conducting layer fills a remainder of the recess not filled by the first conducting layer, while maintaining an air gap defined between the sidewalls of the thereof. The air gap advantageously limits a stress associated therewith. The second thickness, for example, is substantially uniform across the surface. In some embodiments, the second conducting layer comprises polysilicon.

A act 610 portions of the second conducting layer and the second dielectric layer not within the recess are removed by a CMP process, or a photolithographic etch back is utilized alternatively, or in conjunction with the CMP process.

At act 612 portions of the first conducting layer and the first dielectric layer on the surface which are not within a local region of the recess are removed by a pattern and etch process.

At act 614 a first contact is formed to the first conducting layer over the surface, a second contact is formed to the second conducting layer over the recess, and a third contact to the substrate within the local region. In some embodiments, the local region comprises an n-type doped region within a vicinity of the capacitor structure.

FIG. 8 illustrates some embodiments of a method 700 of forming a capacitor structure (e.g., a multi-POLY capacitor structure).

At act 702 a plurality of first POLY layers of uniform thickness are deposited over a bottom region and sidewalls of a recess formed within a substrate and over a surface of the substrate. Alternatively, some other conductive layers may be used in place of the first POLY layers. In some embodiments, the plurality of recesses define first and second arrays, wherein the first and second arrays are rotationally symmetric with one another (e.g., rotated 90 degrees with respect to one another). In some embodiments, the plurality of first POLY layers are separated from one another and the substrate by a plurality of first ONO layers. Alternatively, some other dielectric layers may be used in place of the first ONO layers.

At act 704 a second POLY layer is deposited over the plurality of first POLY layers, wherein the second POLY layer fills a remainder of the recess not filled by the plurality of first POLY layers, while maintaining an air gap defined between the sidewalls of the thereof. Alternatively, some other conductive layer may be used in place of the second POLY layer. The air gap advantageously limits a stress associated therewith. In some embodiments, the second POLY layer is separated from the first POLY layer by a second ONO layer. Alternatively, some other dielectric layer may be used in place of the second ONO layer.

At act 706 portions of the second POLY layer and the second ONO layer not within the recess are removed with a first CMP, etch back, or a combination of the two.

At act 708 a portion of each of the plurality of first POLY layers and the first ONO layers are removed on the surface which are not within a vicinity of the recess with a plurality of first pattern and etch processes such that a top surface of each of the plurality of first polysilicon layers is exposed over the doped region.

Figure 9A:
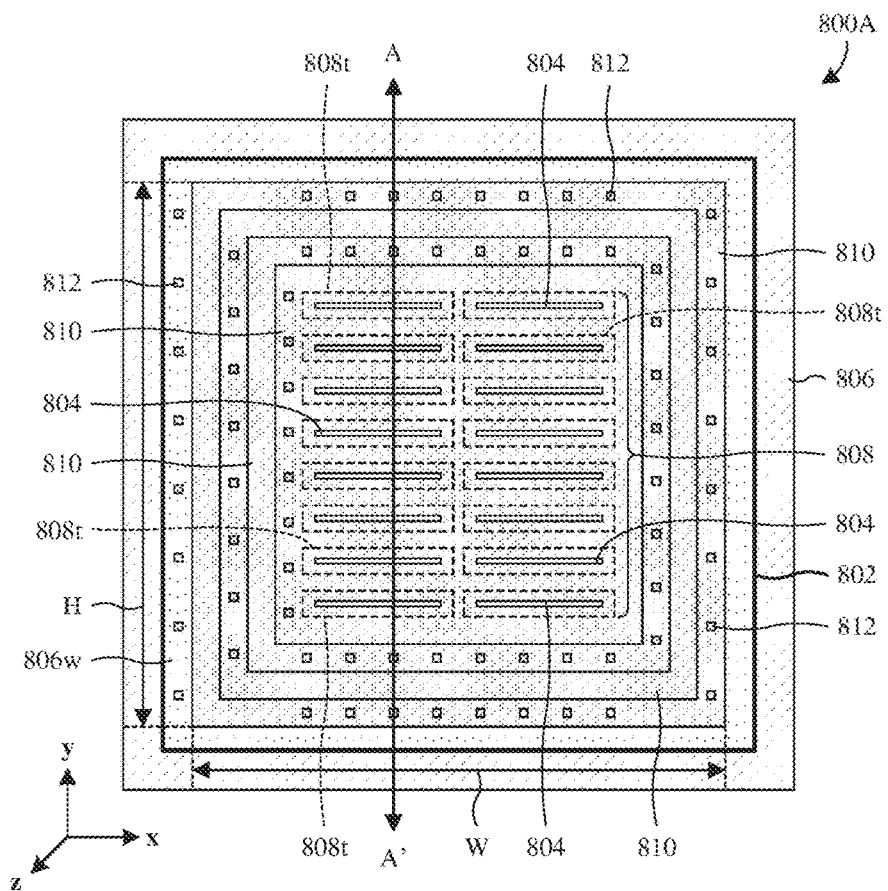
FIGS. 9A and 9B illustrate various views of some embodiments of a trench capacitor.
Figure 9B:
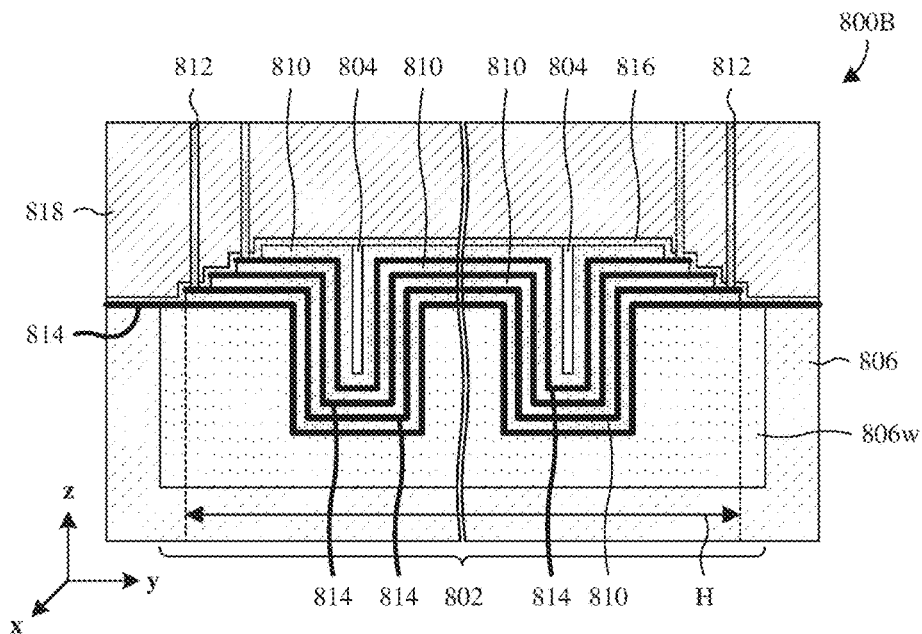

With reference to FIGS. 9A and 9B, various views 800A. 800B of some embodiments of a trench capacitor 802 with strain relieving air gaps 804 are provided. For ease of illustration, only some of the strain relieving air gaps 804 are labeled 804. FIG. 9A is a plan view 800A of the trench capacitor 802. FIG. 9B is a cross-sectional view 800B of the trench capacitor 802. The cross-sectional view 800B may, for example, be taken along line A-A' in FIG. 9A.

As illustrated by the cross-sectional view 800A of FIG. 9A, a semiconductor substrate 806 defines a two-dimensional (2D) trench array 808 of trenches 808t. For ease of illustration, only some of the trenches 808t are labeled 808t. The semiconductor substrate 806 may be, for example, a bulk silicon substrate, a silicon-on-insulator (SOI) substrate, a group III-V substrate, or some other semiconductor substrate.

The 2D trench array 808 comprises a plurality of rows and a plurality of columns. In some embodiments, the 2D trench array 808 comprises two columns (e.g., in an x dimension) and 8 rows (e.g., in a y dimension). Further, the trenches 808t of the 2D trench array 808 have mirror symmetry in both dimensions of the 2D trench array 808. For example, the 2D trench array 808 may be symmetric about a first axis equally bisecting the 2D trench array 808 in the x dimension, and may further be symmetric about a second axis equally bisecting the 2D trench array 808 in the y dimension. In some embodiments, the trenches 808t of the 2D trench array 808 have the same layout and/or the same orientation. For example, the trenches 808t may each be oriented lengthwise in the x dimension. Further, in some embodiments, the trenches of each column are aligned (e.g., in the y dimension) with each other trench in the column, and/or the trenches of each row are aligned (e.g., in the x dimension) with each other trench in the row.

One or more capacitor electrodes 810 are vertically stacked (e.g., in a z dimension) on the 2D trench array 808. For example, as illustrated, four capacitor electrodes may be stacked on the 2D trench array 808. The capacitor electrode(s) 810 partially fill the trenches 808t and, as seen hereafter, each conformally line the trenches 808t. Further, because the capacitor electrode(s) 810 only partially fill the trenches 808t, the capacitor electrode(s) 810 define the strain relieving air gaps 804. The strain relieving air gaps 804 each extend along the length of a respective one of the trenches 808t and alleviate stress induced in the semiconductor substrate 806 by the mirror symmetry of the trenches 808t. This, in turn, reduces the likelihood of the semiconductor substrate 806 warping, breaking, or cracking. In some embodiments, widths W of the capacitor electrode(s) 810 decrease from an outermost capacitor electrode to a centermost capacitor electrode, and/or heights H of the electrode(s) 810 decrease from the outermost capacitor electrode to the centermost capacitor electrode.

In some embodiments, the semiconductor substrate 806 comprises a doped well 806w underlying the capacitor electrode(s) 810. The doped well 806w may, for example, define another capacitor electrode, and/or may, for example, have an opposite doping type as adjoining regions of the semiconductor substrate 806. For example, the doped well 806w may be p-type, whereas the adjoining regions of the semiconductor substrate 806 may be n-type, or vice versa.

A plurality of contact vias 812 overlie the capacitor electrode(s) 810 and, where present, the doped well 806w.

For ease of illustration, only some of the contact vias 812 are labeled 812. The contacts vias 812 electrically couple the capacitor electrode(s) 810 and the doped well 806 to an overlying (e.g., overlying in the z dimension) back end of line (BEOL) metallization stack, where the capacitor electrode(s) 810 and the doped well 806w may be electrically coupled respectively to a first terminal of the trench capacitor 802 and a second terminal of the trench capacitor 802.

As illustrated by the cross-sectional view 800B of FIG. 9B, the capacitor electrode(s) 810 each conformally line the trenches 808t. Further, the capacitor electrode(s) 810 are each separated from the semiconductor substrate 806 and/or an underlying capacitor electrode by a capacitor dielectric layer 814 individual to the capacitor electrode. Note that the capacitor dielectric layer(s) 814 are omitted from the plan view 800A of FIG. 9A for illustrative purposes. The capacitor dielectric layer(s) 814 may be, for example, silicon nitride, silicon oxide, some other dielectric, or any combination of the foregoing.

A capping layer 816 covers the capacitor electrode(s) 810 and the capacitor dielectric layer(s) 814, and an ILD layer 818 covers the capping layer 816. Note that the capping layer 816 and the ILD layer 818 are omitted from the plan view 800A of FIG. 9A for illustrative purposes. The capping layer 816 and the ILD layer 818 accommodate the contact vias 812. For ease of illustration, only some of the contact vias 812 are labeled 812. Further, the capping layer 816 may, for example, serve as an etch stop while forming the contact vias 812. The capping layer 816 may be, for example, silicon nitride, silicon carbide, silicon oxide, or some other dielectric. The ILD layer 818 may be, for example, silicon oxide, silicon nitride, a low κ dielectric, some other dielectric, or any combination of the foregoing. As used herein, a low κ dielectric is a dielectric with a dielectric constant κ less than about 3.9, 3, 2, or 1.

Figure 10A:
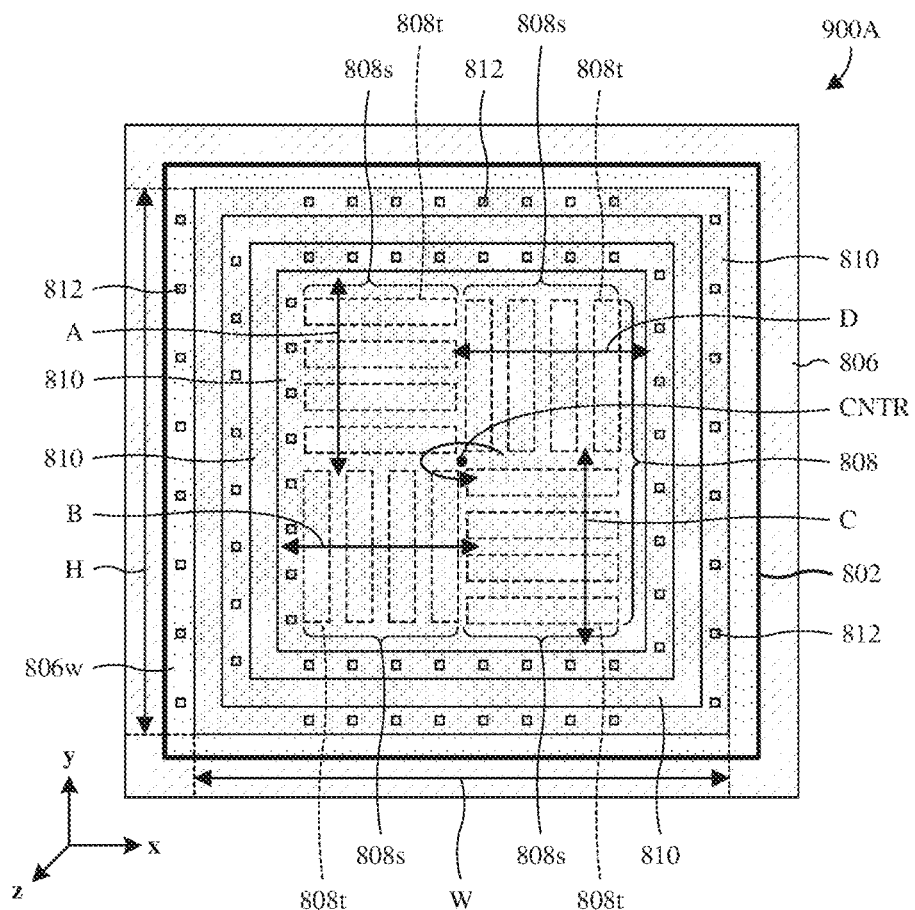
FIGS. 10A and 10B illustrate various views of some other embodiments of the trench capacitor of FIGS. 9A and 9B.
Figure 10B:
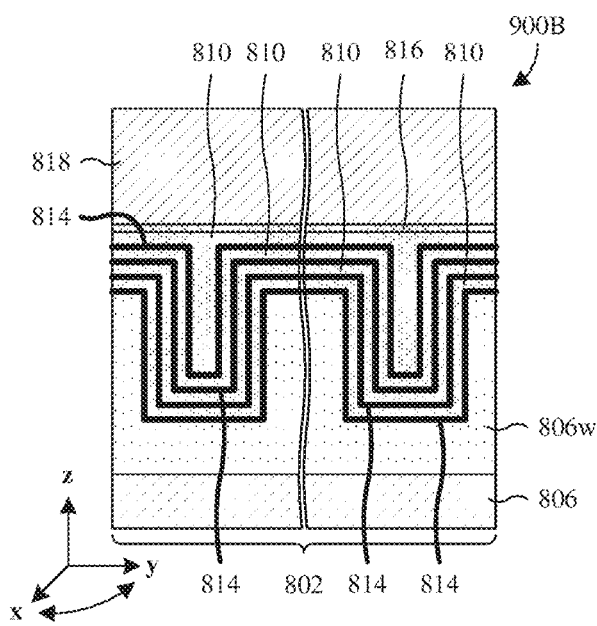

With reference to FIGS. 10A and 10B, various views 900A. 900B of some other embodiments of the trench capacitor 802 of FIGS. 9A and 9B are provided. FIG. 10A is a plan view 900A of the trench capacitor 802. FIG. 10B is a cross-sectional view 900B of the trench capacitor 802. The cross-sectional view 900B may, for example, be representative of the trench capacitor 802 along line A in FIG. 10A, line B in FIG. 10A, line C in FIG. 10A, line D in FIG. 10A, each of lines A-D in FIG. 10A, or any combination of the foregoing.

As illustrated, instead of the strain relieving air gaps 804, rotational symmetry in the 2D trench array 808 alleviate stress induced in the semiconductor substrate 806 by the trenches 808t. The 2D trench array 808 is divided into four segments 808s, and the segments 808s are each rotated about 90 degrees relative to an adjoining segment as one rotates about a center CNTR of the 2D trench array 808. The segments 808s have the same number of trenches 808t and, in some embodiments, the same shape and/or the same size. Further, the segments 808s each border an outer edge of the 2D trench array 808. In some embodiments, the trenches 808t have the same layout across the segments 808s. Further, in some embodiments, the trenches of each segment have the same layout and/or the same orientation as each other trench in the segment.

Figure 11A:
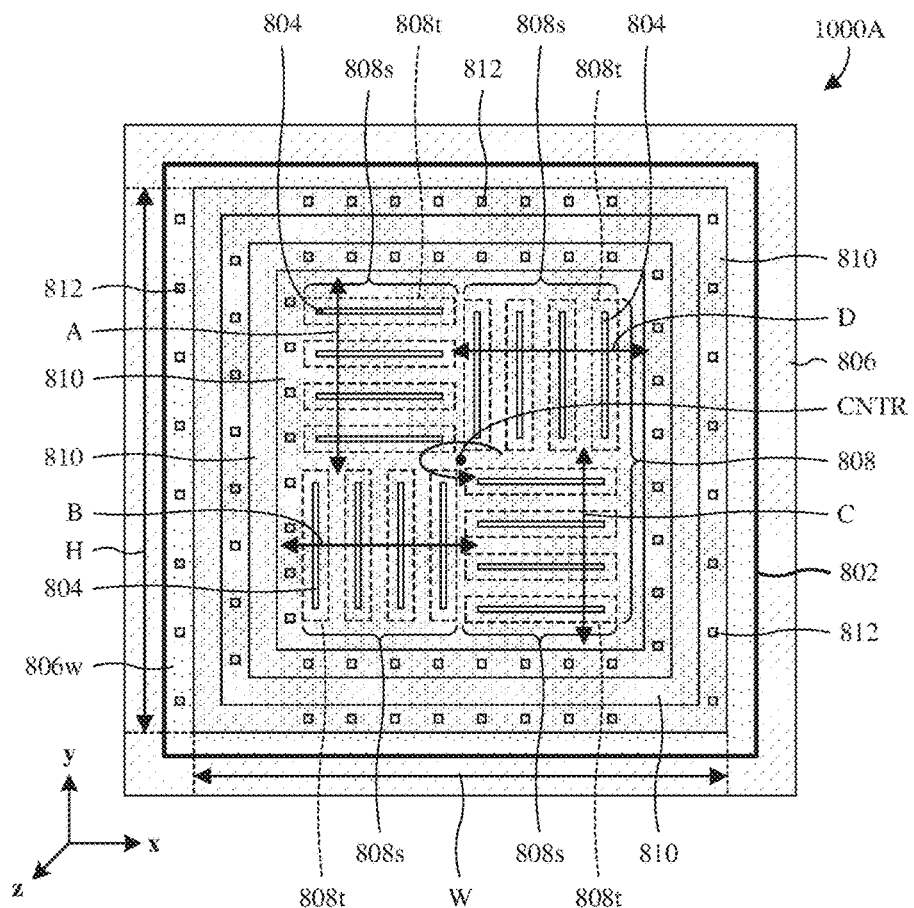
FIGS. 11A and 11B illustrate various views of some other embodiments of the trench capacitor of FIGS. 9A and 9B.
Figure 11B:
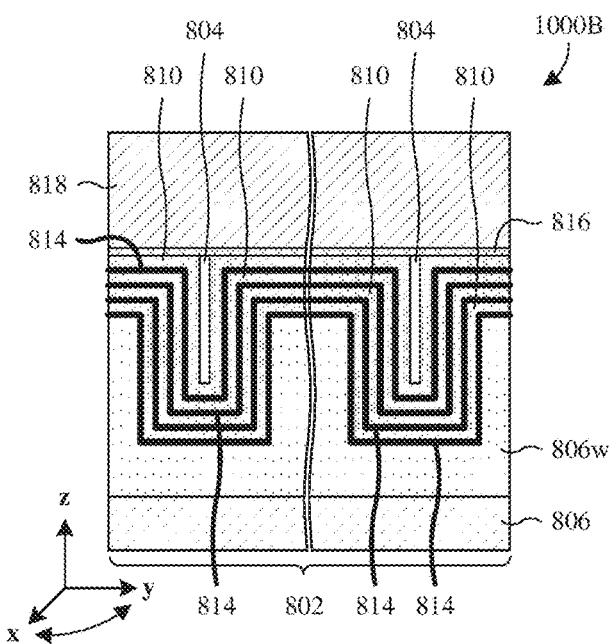

With reference to FIGS. 11A and 11B, various views 1000A. 1000B of some other embodiments of the trench capacitor 802 of FIGS. 9A and 9B are provided. FIG. 11A is a plan view 100A of the trench capacitor 802. FIG. 11B is a cross-sectional view 1000B of the trench capacitor 802. The cross-sectional view 1000B may, for example, be representative of the trench capacitor 802 along line A in FIG. 11A, line B in FIG. 11A, line C in FIG. 11A, line D in FIG. 11A, each of lines A-D in FIG. 1A, or any combination of the foregoing. As illustrated, the strain relieving air gaps 804 of FIGS. 9A and 9B and the rotational symmetry of FIGS. 10A and 10B alleviate stress induced in the semiconductor substrate 806 by the trenches 808t.

Therefore, it will be appreciated that some embodiments of the present disclosure relate to a capacitor structure and a method of forming a capacitor structure.

In some embodiments, a method of forming a capacitor structure is disclosed. The method comprises forming a two-dimensional trench array within a substrate, wherein the two-dimensional trench array has a plurality of segments defined therein. The plurality of segments, for example, are rotationally symmetric about a center of the two-dimensional trench array. Each of the plurality of segments comprises an array of a plurality of recesses having a predetermined length extending along a surface of the substrate. A first dielectric layer is deposited over a bottom region and sidewalls of the plurality of recesses and over the surface of the substrate. A first conducting layer of a first thickness is deposited over the first dielectric layer, wherein the first thickness is substantially uniform. A second dielectric layer is deposited over the first conducting layer, and a second conducting layer of a second thickness is deposited over the second dielectric layer, wherein the second thickness is substantially uniform. Portions of the second conducting layer and the second dielectric layer not within the recess are removed, and portions of the first conducting layer and the first dielectric layer on the surface which are not within a local region of the plurality of recesses are removed. A first contact to the first conducting layer is formed over the surface, a second contact to the second conducting layer is formed, and a third contact to the substrate is formed within a doped region of the substrate.

In some embodiments, the method comprises depositing the second conductive layer such that the second conductive layer fills a remainder of the recess not filled by the first conductive layer while maintaining an air gap between the respective sidewalls of the plurality of recesses.

In some embodiments, a capacitor structure is disclosed. The capacitor structure comprises a doped region of a substrate having a two-dimensional trench array defined therein. The two-dimensional array has a plurality of segments defined therein, wherein each of the plurality of segments comprises an array of a plurality of recesses in the substrate having a predetermined length extending along a surface of the substrate. The plurality of segments are rotationally symmetric about a center of the two-dimensional trench array. A first conducting layer of a first thickness is disposed over a bottom region and sidewalls of the plurality of recesses and over the surface of the substrate. The first conducting layer, for example, is insulated from the substrate by a first dielectric layer. A second conducting layer is disposed over the first conducting layer and is insulated from the first conducting layer by a second dielectric layer. A first contact is connected to an exposed top surface the first conducting layer, a second contact connected to the second conducting layer, and a third contact connected to the substrate within a local region to the capacitor structure.

In some embodiments, a semiconductor die is provided. The semiconductor die comprises a plurality of capacitor structures defined in a substrate. Each of the plurality of capacitor structures comprises a two-dimensional trench array having a plurality of segments defined therein. The plurality of segments are rotationally symmetric about a center of the two-dimensional trench array, wherein each of the plurality of segments comprises an array of a plurality of recesses having a predetermined length extending along a surface of the substrate. A first conducting layer of a first thickness is disposed over a bottom region and sidewalls of the plurality of recesses and over the surface of the substrate, wherein the first conducting layer is insulated from the substrate by a first dielectric layer. A second conducting layer is further disposed over the first conducting layer and is insulated from the first conducting layer by a second dielectric layer.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having". "has", "with", or variants thereof are used in either the detailed description and the claims, such terms are intended to be inclusive in a manner similar to the term "comprising".

What is claimed is:

1. A semiconductor device, comprising:
  a substrate;
  a trench array having a plurality of capacitor trench segments disposed in the substrate, wherein the plurality of capacitor trench segments has mirror symmetry about a first axis and a second axis of the trench array, wherein the first axis is along a first direction and the second axis is along a second direction that is different than the first direction;
  a first dielectric layer disposed in the plurality of capacitor trench segments, wherein the first dielectric layer is along a bottom and sidewalls of the plurality of capacitor trench segments;
  a first conducting layer disposed in the plurality of capacitor trench segments, wherein the first conducting layer is insulated from the substrate by the first dielectric layer, and further wherein the first conducting layer has a first thickness that is substantially uniform along the bottom and the sidewalls of the plurality of capacitor trench segments;
  a second conducting layer disposed over the first conducting layer and insulated from the first conducting layer by a second dielectric layer; and
  air gaps disposed in the second conducting layer, wherein dimensions of the air gaps maintain the second conducting layer with a second thickness that is substantially uniform along the bottom and the sidewalls of the plurality of capacitor trench segments and the second thickness is substantially equal to the first thickness.

2. The semiconductor device of claim 1, wherein the plurality of capacitor trench segments are arranged in rows along the first direction and columns along the second direction.

3. The semiconductor device of claim 2, wherein respective capacitor trench segments in a portion of the plurality of capacitor trench segments in a respective row are aligned with one another and respective capacitor trench segments in a portion of the plurality of capacitor trench segments in a respective column are aligned with one another.

4. The semiconductor device of claim 1, wherein the second conducting layer has sidewall portions along the sidewalls of the plurality of capacitor trench segments, bottom portions along the bottom of the plurality of capacitor trench segments, and top portions over a top surface of the substrate, wherein the air gaps extend from the bottom portions to above the top surface of the substrate.

5. The semiconductor device of claim 1, further comprising:
  a first contact connected to the first conducting layer over the substrate;
  a second contact connected to the second conducting layer; and
  a third contact connected to the substrate within a local region to the plurality of capacitor trench segments.

6. The semiconductor device of claim 5, wherein the substrate comprises a p-type silicon substrate, and wherein the local region comprises an n-type doped region within a vicinity of the capacitor trench segments.

7. The semiconductor device of claim 1, wherein the first and second conducting layers comprise polysilicon.

8. The semiconductor device of claim 1, wherein the first and second dielectric layers comprise oxide/nitride/oxide.

9. The semiconductor device of claim 1, wherein at least one of the first conducting layer and the second conducting layer is electronically coupled to an integrated circuit by a wire bond, a through silicon via, or a bond pad.

10. The semiconductor device of claim 1, wherein the plurality of capacitor trench segments reside within a dynamic random-access memory storage cell.

11. A semiconductor device, comprising:
  a substrate;
  a two-dimensional trench array having a plurality of trenches defined therein, wherein the plurality of trenches has mirror symmetry about a first axis and a second axis of the two-dimensional trench array, wherein the first axis is along a first direction and the second axis is along a second direction that is different than the first direction, and wherein each of the plurality of trenches is oriented lengthwise along the first direction;
  a first dielectric layer disposed in a bottom region of the plurality of trenches, along sidewalls of the plurality of trenches, and over a surface of the substrate;
  a first conducting layer disposed over the first dielectric layer and over the surface of the substrate, wherein the first conducting layer is insulated from the substrate by the first dielectric layer, the first conducting layer has a first width along the first direction, and the first conducting layer has a first height along the second direction; and
  a second conducting layer disposed over the first conducting layer and insulated from the first conducting layer by a second dielectric layer, wherein the second conducting layer has a second width along the first direction and a second height along the second direction, the first width is greater than the second width, and the first height is greater than the second height.

12. The semiconductor device of claim 11, wherein the second conducting layer fills a remainder of the plurality of trenches not filled by the first conducting layer, the first dielectric layer, and the second dielectric layer while maintaining air gaps in the plurality of trenches.

13. The semiconductor device of claim 11, wherein the plurality of trenches is arranged in columns along the second direction and rows along the first direction.

14. The semiconductor device of claim 11, further comprising:
   a capping layer disposed over the second conducting layer; and
   an air gap that extends along a third direction from the capping layer to the second conducting layer, wherein the third direction is different than the second direction and the first direction.

15. The semiconductor device of claim 11, further comprising:
   a first contact connected to the first conducting layer over the surface of the substrate;
   a second contact connected to the second conducting layer; and
   a third contact connected to the substrate within a local region to the two-dimensional trench array.

16. The semiconductor device of claim 15, wherein the substrate comprises a p-type silicon substrate, and wherein the local region comprises an n-type doped region within a vicinity of the two-dimensional trench array.

17. The semiconductor device of claim 11, wherein the first and second conducting layers comprise polysilicon.

18. The semiconductor device of claim 11, wherein the first and second dielectric layers comprise oxide/nitride/oxide.

19. The semiconductor device of claim 11, wherein at least one of the first conductive layer and the second conductive layer is electronically coupled to an integrated circuit by a wire bond, a through silicon via, or a bond pad.

20. A semiconductor device, comprising:
   a substrate;
   a trench array having a plurality of trenches defined therein, wherein the plurality of trenches has mirror symmetry about a first axis and a second axis of the trench array, wherein the first axis is along a first direction and the second axis is along a second direction that is different than the first direction
   a first dielectric layer disposed in a bottom region of the plurality of trenches, along sidewalls of the plurality of trenches, and over a surface of the substrate;
   a first conducting layer disposed over the first dielectric layer and over the surface of the substrate, wherein the first conducting layer is insulated from the substrate by the first dielectric layer;
   a second conducting layer disposed over the first conducting layer and over the surface of the substrate, wherein the second conducting layer is insulated from the first conducting layer by a second dielectric layer, and further wherein an air gap is present between inner sidewalls of the second conducting layer; and
   a capping layer disposed over the second conducting layer, wherein the air gap extends to the capping layer.

* * * * *